US009702685B2

(12) United States Patent
Kim et al.

(10) Patent No.: US 9,702,685 B2
(45) Date of Patent: Jul. 11, 2017

(54) BROADBAND WAVELENGTH-SWEPT LIGHT SOURCE SYSTEM AND APPARATUS EMPLOYING THE SAME

(71) Applicant: SAMSUNG ELECTRONICS CO., LTD., Suwon-si (KR)

(72) Inventors: Hong-sig Kim, Seongnam-si (KR); Woo-young Jang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 36 days.

(21) Appl. No.: 14/508,052

(22) Filed: Oct. 7, 2014

(65) Prior Publication Data
US 2015/0131105 A1 May 14, 2015

(30) Foreign Application Priority Data
Nov. 12, 2013 (KR) .................. 10-2013-0137107

(51) Int. Cl.
| | | |
|---|---|---|
| H01S 3/00 | (2006.01) | |
| G01B 9/02 | (2006.01) | |
| G02B 27/10 | (2006.01) | |
| H01S 3/07 | (2006.01) | |
| H01S 5/14 | (2006.01) | |
| H01S 3/08 | (2006.01) | |

(Continued)

(52) U.S. Cl.
CPC ..... *G01B 9/02004* (2013.01); *G01B 9/02091* (2013.01); *G02B 27/1006* (2013.01); *H01S 3/07* (2013.01); *H01S 5/141* (2013.01); *H01S 3/083* (2013.01); *H01S 3/08009* (2013.01); *H01S 3/105* (2013.01); *H01S 5/06216* (2013.01); *H01S 5/4062* (2013.01)

(58) Field of Classification Search
CPC .... G01B 9/02004; G01B 9/02091; H01S 3/00
USPC ......................................................... 356/497
See application file for complete search history.

(56) References Cited

U.S. PATENT DOCUMENTS

| | | | | |
|---|---|---|---|---|
| 7,414,779 B2 * | 8/2008 | Huber | ..................... | H01S 3/106 |
| | | | | 359/333 |
| 2008/0165366 A1 | 7/2008 | Schmitt | | |

(Continued)

OTHER PUBLICATIONS

Oh, et al., "Wide Tuning Range Wavelength-Swept Laser With Two Semiconductor Optical Amplifiers", IEEE Photonics Technology Letters, Mar. 2005, pp. 678-680, vol. 17, No. 3.

*Primary Examiner* — Jonathan Hansen
(74) *Attorney, Agent, or Firm* — Sughrue Mion, PLLC

(57) ABSTRACT

A light source system includes: a plurality of gain mediums configured to output a corresponding plurality of lights having different center wavelengths from each other; a first light source part configured to connect the plurality of gain mediums to each other in parallel and emit the plurality of lights; a wavelength-swept filter unit configured to sweep wavelengths of the plurality of lights output by the plurality of gain mediums and compensate for spectroscopic optical paths of the plurality of lights; a second light source part configured to connect the first light source part to the wavelength-swept filter unit in series and feed the wavelength-swept lights back to the plurality of gain mediums; a combiner configured to combine the wavelength-swept lights and output a combined wavelength-swept; and a controller configured to control an output magnitude and a wavelength region of the wavelength-swept lights.

18 Claims, 7 Drawing Sheets

(51) Int. Cl.
  *H01S 3/083* (2006.01)
  *H01S 3/105* (2006.01)
  *H01S 5/062* (2006.01)
  *H01S 5/40* (2006.01)

(56) References Cited

U.S. PATENT DOCUMENTS

2008/0232410 A1* 9/2008 Bouma .................... G01J 3/02
 372/20
2010/0254415 A1* 10/2010 Oh ...................... H01S 3/08009
 372/20
2011/0134433 A1* 6/2011 Yamada ............... A61B 5/0062
 356/479

* cited by examiner

BROADBAND WAVELENGTH-SWEPT LIGHT SOURCE SYSTEM AND APPARATUS EMPLOYING THE SAME

CROSS-REFERENCE TO RELATED APPLICATIONS

This application claims the benefit of Korean Patent Application No. 10-2013-0137107, filed on Nov. 12, 2013, in the Korean Intellectual Property Office, the disclosure of which is incorporated herein in its entirety by reference.

BACKGROUND

1. Field

One or more exemplary embodiments of the present disclosure relate to a light source system and an apparatus employing the same, and more particularly, to a broadband wavelength-swept light source system and an apparatus employing the same.

2. Description of the Related Art

Optical systems have been used in a variety of ways for observation of tissue and cells or diagnosis in the biology and medical fields.

In particular, since an inner structure of a body may be observed by using characteristics of light without directly making an incision in the body, identification and treatment of the causes and positions of various diseases may be easily and safely performed. With the development of light source technology, light penetration depth is improved and therefore, the technology has been applied to a field of obtaining a tomographic image of living tissue or a cell.

There is a need for a high-resolution optical coherence tomography (OCT) system in order to precisely identify living tissue. In order to obtain a high-resolution image, axial resolution determined by the center wavelength and bandwidth of a light source and lateral resolution determined by a lens design need to be improved.

SUMMARY

One or more exemplary embodiments provide a broadband wavelength-swept light source system which is usable as a light source to obtain a high-resolution image and an apparatus employing the same.

Additional aspects will be set forth in part in the description which follows and, in part, will be apparent from the description, or may be learned by practice of the presented exemplary embodiments.

According to an aspect of an exemplary embodiment, there is provided a broadband wavelength-swept light source system including: a plurality of gain mediums configured to output a corresponding plurality of lights having different center wavelengths from each other by using stimulated emission and amplification of light; a first light source part configured to connect the plurality of gain mediums to each other in parallel and emit the plurality of lights output by the plurality of gain mediums; a wavelength-swept filter configured to sweep wavelengths of the plurality of lights output by the plurality of gain mediums and compensate for spectroscopic optical paths of the plurality of lights; a second light source part configured to connect the first light source part to the wavelength-swept filter in series and feed the wavelength-swept lights from the wavelength-swept filter back to the plurality of gain mediums; a combiner configured to combine the wavelength-swept lights fed back to the respective plurality of gain mediums and output a combined wavelength-swept light; and a controller configured to control an output magnitude and a wavelength region of the wavelength-swept lights fed back to the respective plurality of gain mediums by controlling at least one of a magnitude of currents respectively applied to the plurality of gain mediums and time point when the currents are respectively applied to the plurality of gain mediums.

The wavelength-swept filter unit may include: a spectroscope configured to perform a spectral analysis of the plurality of lights output by the respective plurality of gain mediums according to wavelengths and thereby output spectral analysis light; a relay lens portion configured to relay and focus the spectral analysis light; a polygon mirror configured to reflect the spectral analysis light focused by the relay lens portion; and a plurality of reflective mirrors configured to reflect the spectral analysis light reflected by the polygon mirror back to the polygon mirror to thereby generate the wavelength-swept lights.

The plurality of reflective mirrors may be disposed to compensate for the spectroscopic optical paths.

The distances of the plurality of reflective mirrors from the polygon mirror may be configured to be adjusted to compensate for optical path length differences due to the spectroscopic optical paths and to adjust oscillation orders of the wavelength-swept lights on a time axis.

The spectroscope may be a reflection-type diffraction grating.

The broadband wavelength-swept light source system may further include a delayer configured to adjust an optical path length on a resonance path of light generated by at least one of the plurality of gain mediums.

The controller may be configured to control the currents respectively applied to the plurality of gain mediums such that wavelengths of the plurality of lightsare swept in sequence through the plurality of gain mediums.

The controller may be configured to synchronize a sweeping rate of the wavelength-swept filter with the currents respectively applied to the plurality of gain mediums.

The broadband wavelength-swept light source system may further include: an optical signal extractor configured to extract an optical signal having a predetermined wavelength region from the combined wavelength-swept light; and a synchronization signal generator configured to generate, based on the extracted optical signal, a synchronization signal which synchronizes an operation of performing the stimulated emission and amplification of light of the plurality of gain mediums with an operation of sweeping a wavelength of the wavelength-swept filter, wherein the control unit may be configured to generate the currents to be respectively applied to the plurality of gain mediums and a control signal to control the wavelength-swept filter based on the synchronization signal.

According to another aspect of an exemplary embodiment, there is provided an optical coherence tomography apparatus including the broadband wavelength-swept light source system.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
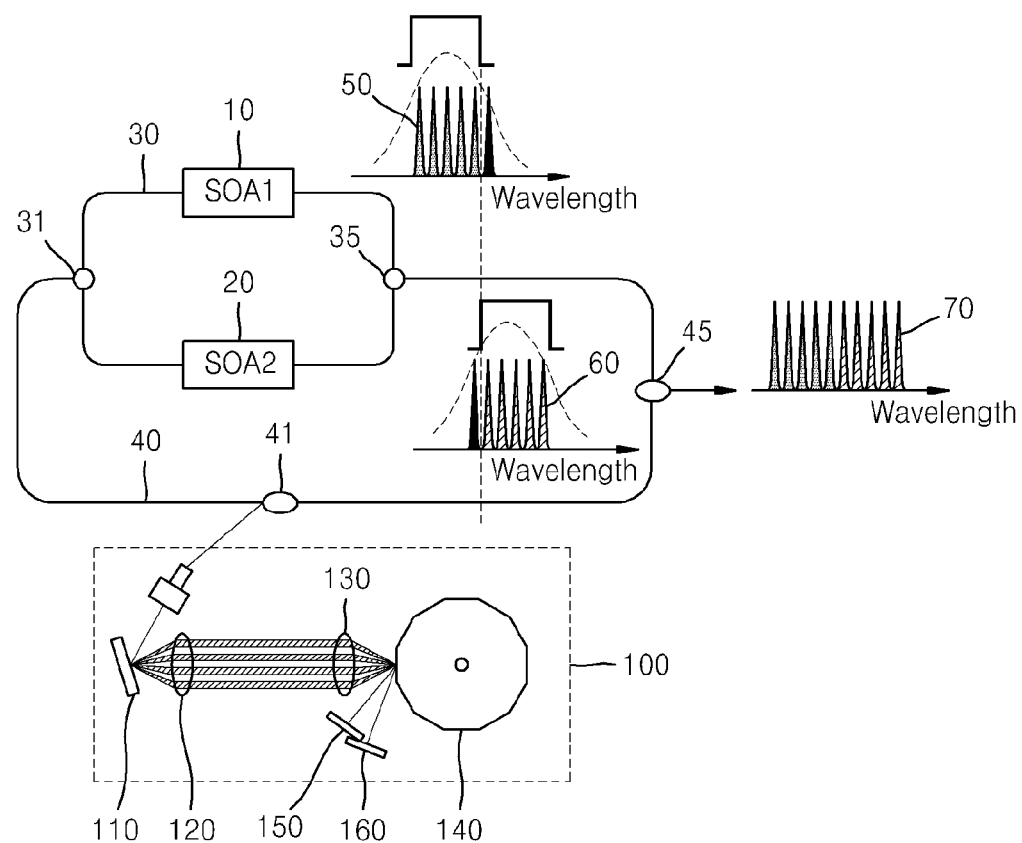
FIG. 1 schematically illustrates an optical configuration of a broadband wavelength-swept light source system according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the exemplary embodiments. Expressions such as "at least one of," when preceding a list of elements, modify the entire list of elements and do not modify the individual elements of the list.

A broadband wavelength-swept light source system according to an exemplary embodiment and an apparatus employing the same will be described in detail with reference to the accompanying drawings below. In the drawings, like reference numerals denote like elements, and the sizes and thicknesses of respective elements may be exaggerated for convenience of description. The exemplary embodiments described hereinafter are merely exemplary, and various changes and modifications may be made therein.

The broadband wavelength-swept light source system according to an exemplary embodiment includes a plurality of gain mediums which output lights having different center wavelengths by using stimulated emission and amplification of the lights and a wavelength-swept filter unit that is provided to sweep the wavelengths of the lights output from the plurality of gain mediums and compensate for spectroscopic optical paths. The broadband wavelength-swept light source system feeds wavelength-swept lights back to the plurality of gain mediums via the wavelength-swept filter unit and combines the plurality of wavelength-swept lights generated from the plurality of gain mediums to output one wavelength-swept light. The wavelength-swept filter unit is configured by a polygon mirror-based wavelength-swept filter and further includes a plurality of reflective mirrors disposed to compensate for the spectroscopic optical paths. The distances of the plurality of reflective mirrors from a polygon mirror may be adjusted to compensate for optical path length differences due to the spectroscopic optical paths and adjust the oscillation orders of the wavelength-swept lights on a time axis in the plurality of gain mediums. The number of gain mediums and the number of reflective mirrors may be identical to each other or different. Although the plurality of gain mediums may be exemplarily described as including first and second gain mediums and the plurality of reflective mirrors may be exemplarily described as including first and second reflective mirrors below, exemplary embodiments are not limited thereto.

Figure 2:
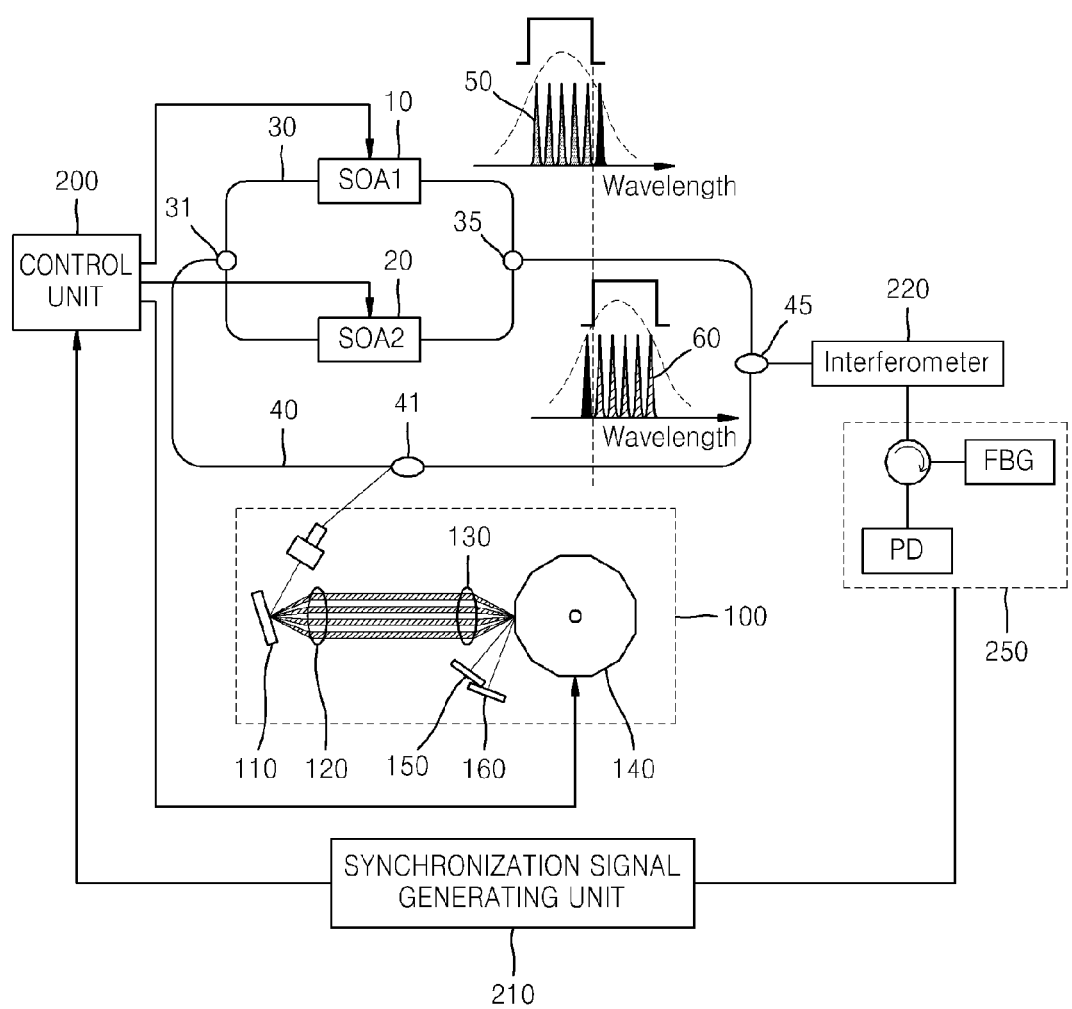
FIG. 2 schematically illustrates an overall structure of the broadband wavelength-swept light source system according to an exemplary embodiment.

FIG. 1 schematically illustrates an optical configuration of a broadband wavelength-swept light source system according to an exemplary embodiment. FIG. 2 schematically illustrates an overall structure of the broadband wavelength-swept light source system according to an exemplary embodiment.

Referring to FIGS. 1 and 2, the broadband wavelength-swept light source system according to an exemplary embodiment includes a first gain medium 10, a second gain medium 20, a first light source part 30 that generates lights through the first and second gain mediums 10 and 20, a wavelength-swept filter unit 100 (e.g., wavelength-swept filter), a second light source part 40 that feeds wavelength-swept lights from the wavelength-swept filter unit 100 back to the first and second gain mediums 10 and 20, and a combiner that combines a first wavelength-swept light 50 and a second wavelength-swept light 60 generated through the first and second gain mediums 10 and 20 to output a third wavelength-swept light 70. The first and second gain mediums 10 and 20, and the wavelength-swept filter unit 100, may be controlled by the control unit 200.

The first and second gain mediums 10 and 20 are provided for stimulated emission of lights having different center wavelengths and amplification of the emitted lights by using stimulated emission and amplification. The wavelengths of lights output through the first and second gain mediums 10 and 20 may be determined according to the characteristics of the mediums. At least one of the first and second gain mediums 10 and 20 may be, for example, a semiconductor optical amplifier. In FIG. 1, semiconductor optical amplifiers SOA1 and SOA2 may be used respectively for the first gain medium 10 and the second gain medium 20. Various gain mediums, in which the output magnitude and wavelength region of a light emitted by an applied current are controllable, may be used for the first and second gain mediums 10 and 20 except for the semiconductor optical amplifier.

In this case, the wavelength region and center wavelength of the first wavelength-swept light 50 generated through the first gain medium 10 are determined according to the characteristics of the first gain medium 10. In addition, the wavelength region and center wavelength of the second wavelength-swept light 60 generated through the second gain medium 20 are determined according to the characteristics of the second gain medium 20. Since a gain medium having characteristics different from those of the first gain medium 10 is used for the second gain medium 20, the center wavelength of the second wavelength-swept light 60 has a different center wavelength from that of the first wavelength-swept light 50. For example, the first gain medium 10 may be implemented using a quantum-dot SOA having a center wavelength of about 1.2 μm, and the second gain medium 20 may be implemented using a quantum-well SOA having a center wavelength of about 1.3 μm. Of course, it is understood that the exemplary embodiments are not limited thereto, and the first and second gain mediums 10 and 20 may be implemented in other ways and/or with other center wavelengths.

The first gain medium 10 and the second gain medium 20 are connected in parallel to each other by the first light source part 30. The first gain medium 10 and the second gain medium 20 are connected in series to the wavelength-swept filter unit 100 by the second light source part 40. For the parallel connection and the serial connection, a first coupler 31 and a second coupler 35 are disposed between the first light source part 30 and the second light source part 40. A third coupler 41 is disposed between the second light source part 40 and the wavelength-swept filter unit 100 to transmit light from the second light source part 40 to the wavelength-swept filter unit 100 and couple the light of which the wavelength is swept by the wavelength-swept filter unit 100 to the second light source part 40. In addition, a fourth coupler 45 is disposed on the path of the second light source part 40 as the combiner so as to combine the first wavelength-swept light 50 generated through the first gain medium 10 and the second wavelength-swept light 60 generated through the second gain medium 20 to output the third wavelength-swept light 70.

The first wavelength-swept light 50 may be generated from light generated from the first gain medium 10 by using the first gain medium 10, the first light source part 30, the second coupler 35, the fourth coupler 45, the second light source part 40, the third coupler 41, the wavelength-swept filter unit 100, and the first coupler 31.

The second wavelength-swept light 60 may be generated through light generated through the second gain medium 20 by using the second gain medium 20, the first light source part 30, the second coupler 35, the fourth coupler 45, the second light source part 40, the third coupler 41, the wavelength-swept filter unit 100, and the first coupler 31.

The first gain medium 10 and the second gain medium 20 may be pulse-driven by a pulse signal controlled by the control unit 200. In the broadband wavelength-swept light source system according to an exemplary embodiment, when the first wavelength-swept light 50 generated through the first gain medium 10 and the second wavelength-swept light 60 generated through the second gain medium 20 travel to the second light source part 40 through the second coupler 35, the lights travel with time differences between each other without being superposed upon each other and are combined by the fourth coupler 45 to be output as illustrated in FIG. 1. In this case, the pulse driving times and optical path lengths of the first and second gain mediums 10 and 20 may be matched with each other so as to output the third wavelength-swept light 70 being combined.

The wavelength-swept filter unit 100 may be provided to sweep the wavelengths of the lights output through the first and second gain mediums 10 and 20 and compensate for spectroscopic optical paths. In addition, the wavelength-swept filter unit 100 may be provided to correct optical path lengths to arrange the generation orders on a time axis of the first wavelength-swept light 50 and the second wavelength-swept light 60 generated in the first and second gain mediums 10 and 20.

The wavelength-swept filter unit 100 may be implemented using, for example, a polygon mirror 140-based wavelength-swept filter. As exemplarily illustrated in FIG. 1, the wavelength-swept filter unit 100 may include a spectroscope 110 that performs a spectral analysis of the lights output through the first and second gain mediums 10 and 20 according to wavelengths, a relay lens portions 120 and 130 that relay and focus the spectral analysis lights, the polygon mirror 140 that reflects the lights focused by the relay lens portions 120 and 130, and first and second reflective mirrors 150 and 160 that feed the wavelength-swept lights back to the first and second gain mediums 10 and 20 by reflecting the lights reflected by the polygon mirror 140 back to the polygon mirror 140.

The spectroscope 110 may be implemented by using, for example, a reflection-type diffraction grating. Since, as is well known, a diffraction grating has different diffraction angles according to wavelengths, light within a predetermined wavelength band may be spectrally analyzed according to wavelengths when entering the diffraction grating. The spectral analysis of the light output through the first and second gain mediums 10 and 20 may be implemented by the spectroscope 110 according to wavelengths.

The relay lens portions 120 and 130 focus the lights spectrally analyzed by the spectroscope 110 according to wavelengths onto the polygon mirror 140.

The polygon mirror 140 has a plurality of mirror surfaces. Since an angle of the incident light to a mirror surface varies when the polygon mirror 140 is rotated, the light reflected from the mirror surface of the polygon mirror 140 is wavelength-swept according to positions of the first reflective mirror 150 or the second reflective mirror 160 onto which the light is radiated and directed. It is understood that the polygon mirror 140 is not limited to being a polygon having planar surfaces, and may also have curved surfaces, may vary with respect to a number of surfaces, and may be configured in numerous other ways according to other exemplary embodiments.

The first and second reflective mirrors 150 and 160 are configured to compensate for spectroscopic optical paths, and reflect the spectral analysis lights that are reflected by the polygon mirror 140 and are incident to the first and second reflective mirrors 150 and 160 back to the polygon mirror 140. In this case, the range of the spectral analysis lights reflected by the polygon mirror 140 and incident on the first and second reflective mirrors 150 and 160 may be wide. Since the plurality of reflective mirrors (e.g., 150 and 160) may be used, the spectral analysis lights may be reflected back to the polygon mirror 140 even when the range of the spectral analysis lights is wide. In this case, the gain mediums may not be in one-to-one correspondence with the reflective mirrors 150 and 160, and the reflective mirrors 150 and 160 may be used appropriately according to wavelength spectrum ranges. For example, light generated through the first gain medium 10 may be partially reflected from not only the first reflective mirror 150 but also the second reflective mirror 160. In addition, light generated through the second gain medium 20 may be partially reflected from not only the second reflective mirror 160 but also the first reflective mirror 150. In a structure additionally employing another gain medium in addition to the first and second gain mediums 10 and 20, two reflective mirrors may only be included, or more than two mirrors may be included.

The distances of the first and second reflective mirrors 150 and 160 from the polygon mirror 140 may be adjusted to compensate for optical path length differences due to spectroscopic optical paths and therefore, the first and second reflective mirrors 150 and 160 may adjust the oscillation orders of the wavelength-swept lights of the first and second gain mediums 10 and 20 on a time axis.

The wavelength-swept light, which is reflected back to the polygon mirror 140 by the first and second reflective mirrors 150 and 160, may be fed back to the first and second gain mediums 10 and 20.

The first light source part 30 moves the lights output through the first and second gain mediums 10 and 20 while resonating the lights. For example, the first light source part 30 may be configured by at least one ring cavity.

The second light source part 40 feeds the wavelength-swept light of which the wavelength is swept by the wavelength-swept filter unit 100 back to the first gain medium 10 and the second gain medium 20. Accordingly, the second light source part 40 amplifies a wavelength-swept light generated by using the first gain medium 10, the second gain medium 20, and the wavelength-swept filter unit 100 until the generated wavelength-swept light has reached a predetermined power. For example, the second light source part 40 may be configured by at least one ring cavity.

The first coupler 31 outputs the wavelength-swept lights to the first light source part 30 to feed the wavelength-swept lights, of which the wavelengths are swept by the wavelength-swept filter unit 100, back to the first gain medium 10 or the second gain medium 20. For example, the first coupler 31 may be implemented as an optical coupler element or a wavelength division multiplexing (WDM) element.

The second coupler 35 outputs light output through the first gain medium 10 or the second gain medium 20 to the second light source part 40. For example, the second coupler 35 may be an optical coupler.

The third coupler 41 is disposed between the second light source part 40 and the wavelength-swept filter unit 100 to transmit the light from the second light source part 40 to the wavelength-swept filter unit 100 and couple the light of which the wavelength is swept by the wavelength-swept filter unit 100 to the second light source part 40. The third coupler 41 may be implemented as an optical coupler or a circulator element.

The fourth coupler 45 combines the first wavelength-swept light 50 generated by the first gain medium 10 with the second wavelength-swept light 60 generated by the second gain medium 20 to output combined third wavelength-swept light 70. In this case, the third coupler 41 outputs a part of the third wavelength-swept light 70 to an optical output apparatus or outputs a part of the third wavelength-swept light 70 back to the first gain medium 10 or the second gain medium 20 through the second light source part 40 to amplify the output of the third wavelength-swept light 70. For example, the third coupler 41 may be implemented as an optical coupler element.

The control unit 200 may control the output magnitude and wavelength region of the wavelength-swept light obtained by feedback in respective gain mediums 10 and 20 by controlling at least one of the magnitude and on/off time point of a current applied to the first and second gain mediums 10 and 20.

A current signal is applied to the first gain medium 10 and the second gain medium 20, and the first wavelength-swept light 50 and the second wavelength-swept light 60 are thereby generated to have output magnitudes and wavelength regions which are controlled by the current signal.

For example, the current signal may be applied to the first gain medium 10 by the control unit 200. When the current signal is applied to the first gain medium 10, the first wavelength-swept light 50 of which the output magnitude and wavelength region of the light are controlled by the current signal is generated through the first gain medium 10. When the current signal is in an on state, the first wavelength-swept light 50 is output in a corresponding wavelength region, and when the current signal is in an off state, the first wavelength-swept light 50 is output in a corresponding wavelength region. Accordingly, the spectrum of the first wavelength-swept light 50 illustrated in FIGS. 1 and 2 may be obtained. Referring to the spectrums of the first wavelength-swept light 50 of FIG. 2, the first wavelength-swept light 50 is not output in a wavelength band of a dark-colored portion corresponding to the off state of a current signal. Therefore, by adjusting the on/off time point of the current signal applied by the control unit 200, the wavelength region of the first wavelength-swept light 50 generated through the first gain medium 10 may be determined and controlled.

The output magnitude of light may be determined and controlled by the magnitude of the current signal in the spectrum of the first wavelength-swept light 50. Accordingly, by adjusting the magnitude of the current signal applied by the control unit 200, the output magnitude of the first wavelength-swept light 50 generated through the first gain medium 10 may be determined and controlled. The spectrum of the first wavelength-swept light 50 illustrated in FIGS. 1 and 2 is an example of an optical spectrum obtained by the second gain medium 10, and various forms of spectrums other than, or in addition to, the spectrum of the first wavelength-swept light 50 illustrated in FIGS. 1 and 2 may be obtained by controlling the current signal.

Similarly, the current signal may be applied to the second gain medium 20 by the control unit 200. Therefore, the second wavelength-swept light 60 of which the output magnitude and wavelength region of the light are controlled by the current signal is generated through the second gain medium 20. Similarly to the first wavelength-swept light 50, when the current signal is in the on state, the second wavelength-swept light 60 is output in a corresponding wavelength region, and when the current signal is in the off state, the second wavelength-swept light 60 is not output in a corresponding wavelength region.

Referring to spectrums of the second wavelength-swept light 60 of FIGS. 1 and 2, the second wavelength-swept light 60 is not output in a wavelength band of a dark-colored portion corresponding to the off state of a current signal. Similar to the first wavelength-swept light 50, the wavelength range of the second wavelength-swept light 60 generated by the second light source part 40 may be determined and controlled by adjusting the on/off time point of the current signal applied by the control unit 200. In addition, the output magnitude of the second wavelength-swept light 60 may be determined and controlled by adjusting the magnitude of the current signal applied by the control unit 200. The spectrums of the second wavelength-swept light 60 illustrated in FIGS. 1 and 2 are an example of an optical spectrum obtained by the second gain medium 20, and various forms of spectrums other than, or in addition to, the spectrums of the second wavelength-swept light 60 illustrated in FIGS. 1 and 2 may be obtained by controlling the current signal.

The first wavelength-swept light 50 and the second wavelength-swept light 60 may have many types of optical spectrums that are similar to the spectrums illustrated in FIGS. 1 and 2. When the first wavelength-swept light 50 and the second wavelength-swept light 60, of which the output magnitudes and wavelength ranges are controlled, are combined with each other, the optical spectrum of the third wavelength-swept light 70, such as the spectrum of the third wavelength-swept light 70 as illustrated in FIG. 1, may be obtained.

Since the oscillating orders of the first wavelength-swept light 50 and the second wavelength-swept light 60 are generated based on an adjustment of the locations of the first and second reflective mirrors 150 and 160, not only the third wavelength-swept light 70, which is a broadband light, may be obtained, but also the oscillating orders of the first wavelength-swept light 50 and the second wavelength-swept light 60, which constitute the third wavelength-swept light 70, may be appropriately set. When the first wavelength-swept light 50 is in a relatively short wavelength region and the second wavelength-swept light 60 is in a relatively long wavelength region, the third wavelength-swept light 70 has a spectrum into which the first wavelength-swept light 50 and the second wavelength-swept light 60 are combined, and the second wavelength-swept light 60 may be controlled to sequentially pass through the fourth coupler 45 to the first wavelength-swept light 50.

As illustrated in FIG. 2, the broadband wavelength-swept light source system according to an exemplary embodiment may further include an optical signal extracting unit 250 (e.g., optical signal extractor) and a synchronization signal generating unit 210 (e.g., synchronization signal generator). In FIG. 2, a reference numeral 220 indicates an interferometer.

The optical signal extracting unit 250 extracts an optical signal having a predetermined wavelength region from the third wavelength-swept light 70 into which the first wavelength-swept light 50 and the second wavelength-swept light 60 are combined. The optical signal extracting unit 250 may be implemented to include at least one of a photo-detector (PD), a fiber Bragg grating (FBG), and/or a circulator. However, exemplary embodiments are not limited thereto, and the optical signal extracting unit 250 may be implemented to include various other elements instead of or in addition the PD, FBG, and circulator. The optical signal may be extracted before reaching the interferometer 220 or even in the optical path of the interferometer 220.

The synchronization signal generating unit 210 generates a synchronization signal for synchronizing the operation of performing stimulated emission and amplification of lights of the first gain medium 10 and the second gain medium 20 with the operation of sweeping the optical wavelength of the wavelength-swept filter unit 100, that is, the polygon mirror 140, based on the extracted optical signal. In this case, the generated synchronization signal may be a transistor-transistor-logic (TTL) signal, or another type of signal may be used instead of or in addition to a TTL signal.

The control unit 200 may further include the optical signal extracting unit 250 and the synchronization signal generating unit 210 and may control the output magnitude and wavelength region of the first wavelength-swept light 50 and the second wavelength-swept light 60 by controlling currents respectively applied to the first gain medium 10 and the second gain medium 20. In addition, the control unit 200 may control the operation of the polygon mirror 140 for the wavelength-swept filter unit 100 based on the synchronization signal.

As described above, the sweeping rate of the wavelength-swept filter unit 100 may be synchronized with a current applied to the first and second gain mediums 10 and 20.

Figure 3:
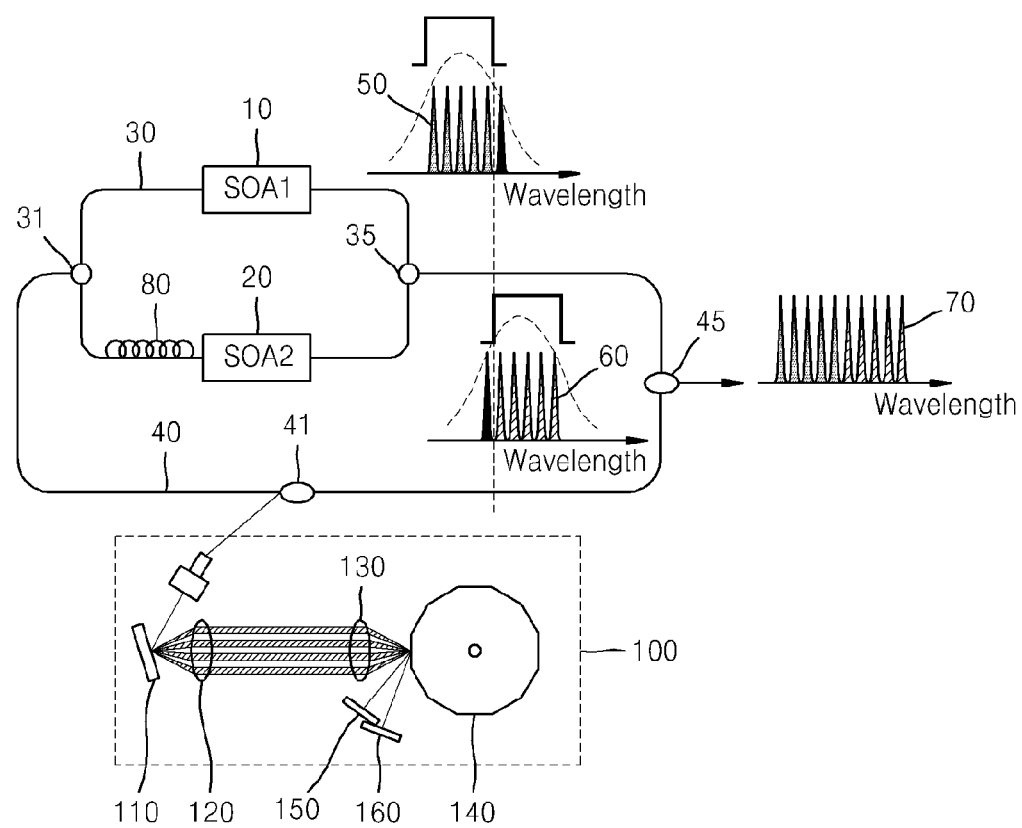
FIG. 3 schematically illustrates an optical configuration of a broadband wavelength-swept light source system according to another exemplary embodiment.

The broadband wavelength-swept light source system according to an exemplary embodiment may further include a delay unit 80 (e.g., delayer) that delays at least one of the wavelength-swept lights by adjusting an optical path length on the resonance path of light generated through at least one of the first gain medium 10 and the second gain medium 20, as illustrated in FIG. 3. As illustrated in FIG. 3, when the delay unit 80 is further included, optical path length differences due to the optical paths are compensated for by the position adjustment of the first and second reflective mirrors 150 and 160, thereby slightly alleviating a load of adjusting the oscillation orders of the first and second gain mediums 10 and 20 on a time axis. That is, the oscillation orders of the first and second gain mediums 10 and 20 on the time axis of the first wavelength-swept light 50 and the second wavelength-swept light 60 constituting the third wavelength-swept light 70 may be adjusted by using the delay unit 80 in addition to adjusting the positions of the first and second reflective mirrors 150 and 160.

Figure 4:
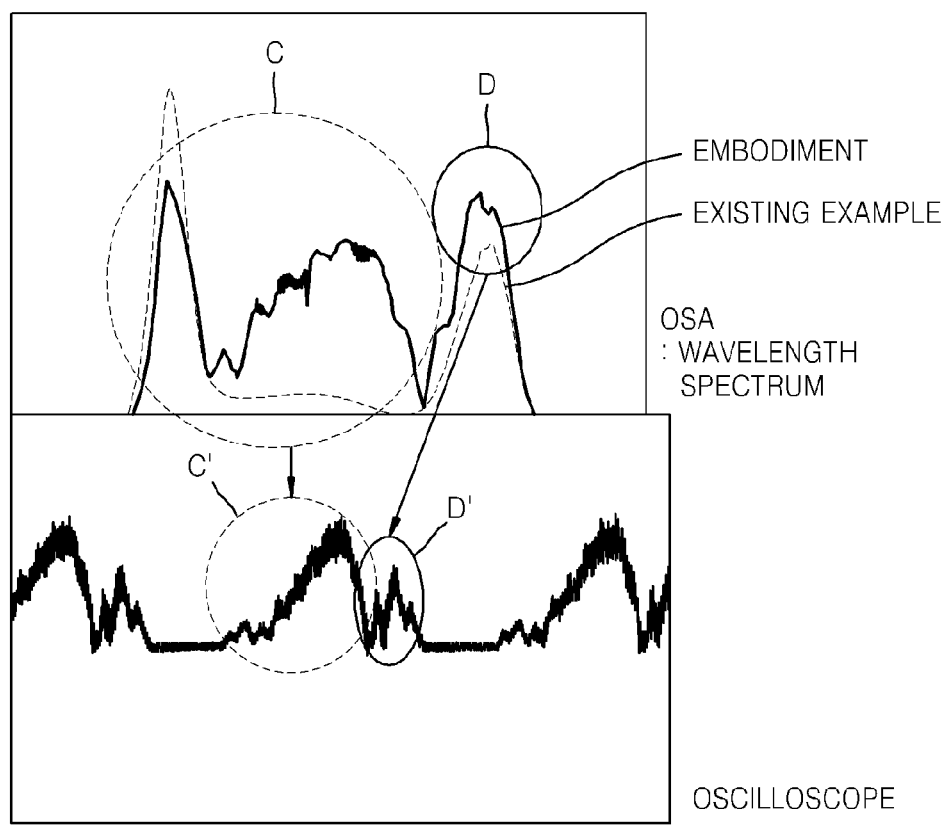
FIG. 4 illustrates wavelength spectrums and positions of the wavelength spectrums on a time axis in a broadband wavelength-swept light source system according to an exemplary embodiment.

FIG. 4 illustrates wavelength spectrums and positions of the wavelength spectrums on a time axis of the broadband wavelength-swept light source system according to exemplary embodiments described above with reference to FIGS. 1 to 3.

In an upper graph of FIG. 4, a dashed line represents the wavelength spectrum of light generated through the first gain medium 10 and the wavelength spectrum of light generated through the second gain medium 20 before the wavelength is swept by the wavelength-swept filter unit 100. As shown in FIG. 4, the dashed line includes two spectrum peaks, from which it may be determined that the spectrums are not superposed.

In the upper graph of FIG. 4, a solid line represents the spectrum of first wavelength-swept light 50 generated through the first gain medium 10 and the spectrum of second wavelength-swept light 60 generated through the second gain medium 20 when the wavelength is swept by the wavelength-swept filter unit 100. As shown in FIG. 4, the solid line includes an intermediate oscillation peak C between the two wavelength spectrum peaks. From this result, it may be determined that the first wavelength-swept light 50 and the second wavelength-swept light 60, which have different center wavelengths, are combined with each other to obtain a third wavelength-swept light 70.

From a lower graph of FIG. 4, it may be determined that, when the wavelength-swept filter unit 100 compensates for length differences due to spectroscopic optical paths to adjust the oscillation orders of the first and second wavelength-swept lights 50 and 60 in the first and second gain mediums 10 and 20 on a time axis, an intermediate oscillation peak C spectrum and a spectrum D of the second wavelength-swept light 60 oscillate into an intermediate oscillation peak C' and an intermediate oscillation peak D' of the second wavelength-swept light 60 without a change in orders on a time axis.

Figure 5:
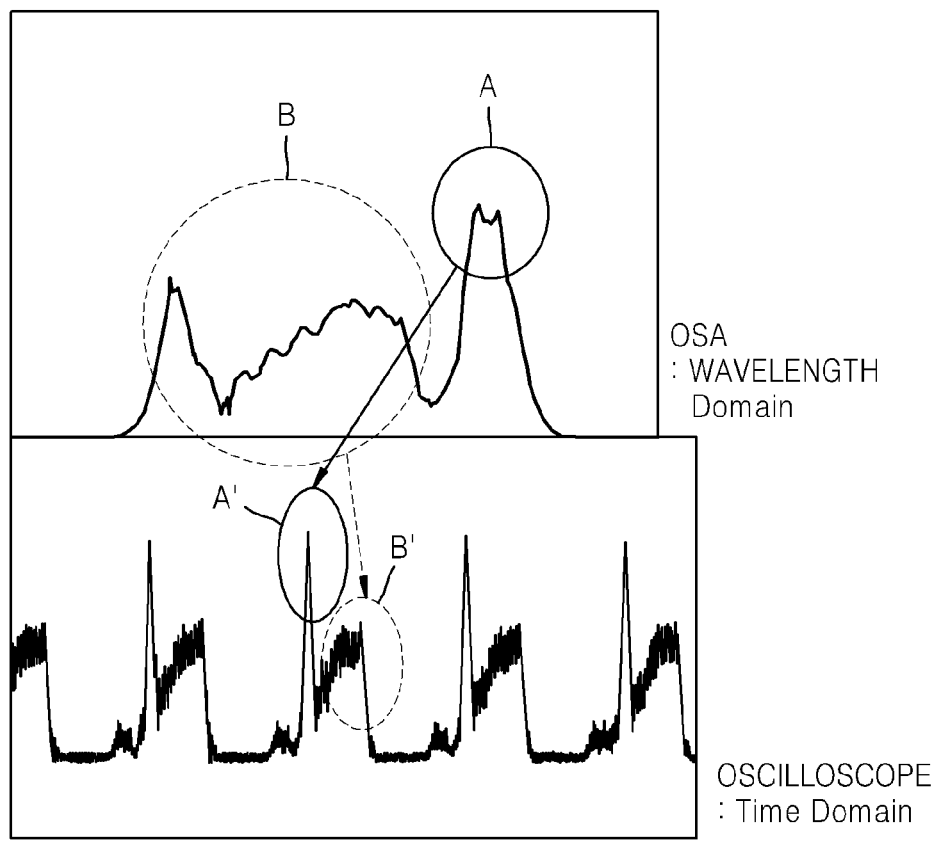
FIG. 5 illustrates wavelength spectrums and positions of the wavelength spectrums on a time axis when a wavelength-swept filter unit is not provided to compensate for length differences due to spectroscopic optical paths, as a comparative example.

FIG. 5 illustrates a comparative example in which the spectrum of an intermediate oscillation peak A and the spectrum B of a second wavelength-swept light 60 are exchanged in the orders thereof on a time axis and oscillation is made in the orders of the second wavelength-swept light 60 peak A' and the intermediate oscillation peak B' when a wavelength-swept filter unit is not provided to compensate for length differences due to spectroscopic optical paths.

The broadband wavelength-swept light source system according to certain exemplary embodiments are illustrated as including the first and second gain mediums 10 and 20 in FIGS. 1 to 3, but these figures are merely exemplary. The broadband wavelength-swept light source system according to exemplary embodiments may further include at least one gain medium through which light having a different center wavelength from center wavelengths of the first and second gain mediums 10 and 20 is output, as illustrated in FIG. 6.

Figure 6:
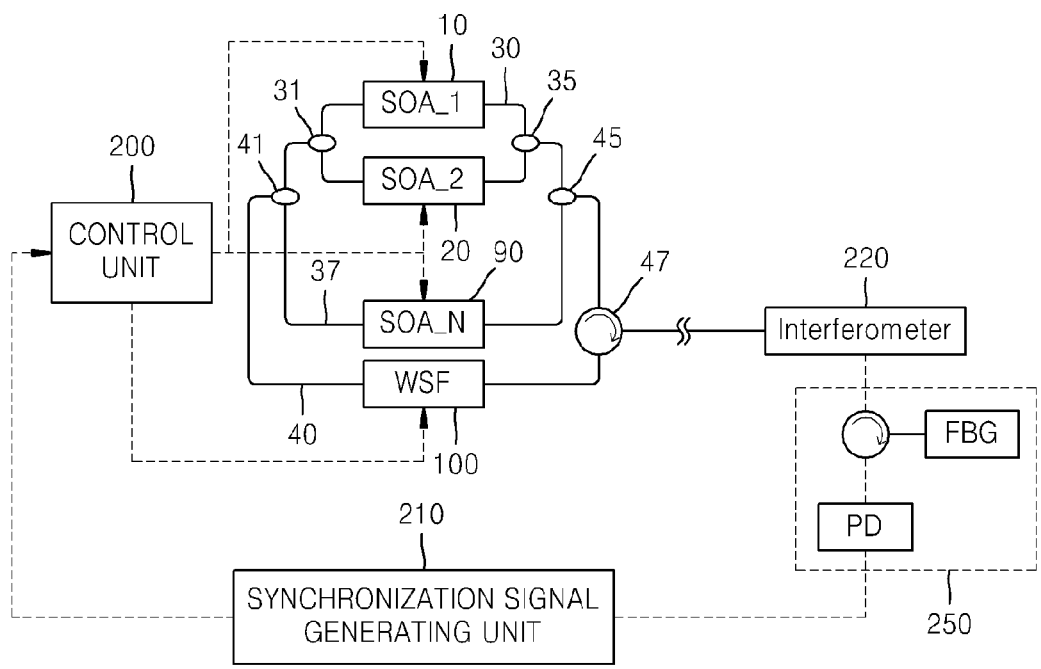
FIG. 6 schematically illustrates an overall structure of a broadband wavelength-swept light source system according to another exemplary embodiment.

FIG. 6 illustrates a case where a broadband wavelength-swept light source system according to an exemplary embodiment includes a first gain medium 10, a second gain medium 20, an N-th gain medium SOA_N 90, and a wavelength-swept filter unit 100. In FIG. 6, a circulator 47 functions as a combiner. In FIG. 6, an optical resonance unit or a coupler may be further included according to the number of added gain mediums, in addition to the first and second light source parts 30 and 40. In FIG. 6, a reference numeral 37 indicates an optical resonance unit (e.g., optical resonator) for the N-th gain medium 90.

In this case, the first wavelength-swept light 50, the second wavelength-swept light 60, and a wavelength-swept light generated through at least one different gain medium are combined with each other to output the third wavelength-swept light 70. The control unit 200 may combine the first wavelength-swept light 50, the second wavelength-swept light 60, and the wavelength-swept light generated by the at least one different gain medium together to output one third wavelength-swept light 70. In this case, the output magnitudes and wavelength regions of the first wavelength-swept light 50, the second wavelength-swept light 60, and the wavelength-swept light generated by the at least one different gain medium are controlled by controlling at least one of the magnitude and on/off time point of currents respectively applied to the first gain medium 10, the second gain medium 20, and the at least one different gain medium.

Figure 7:
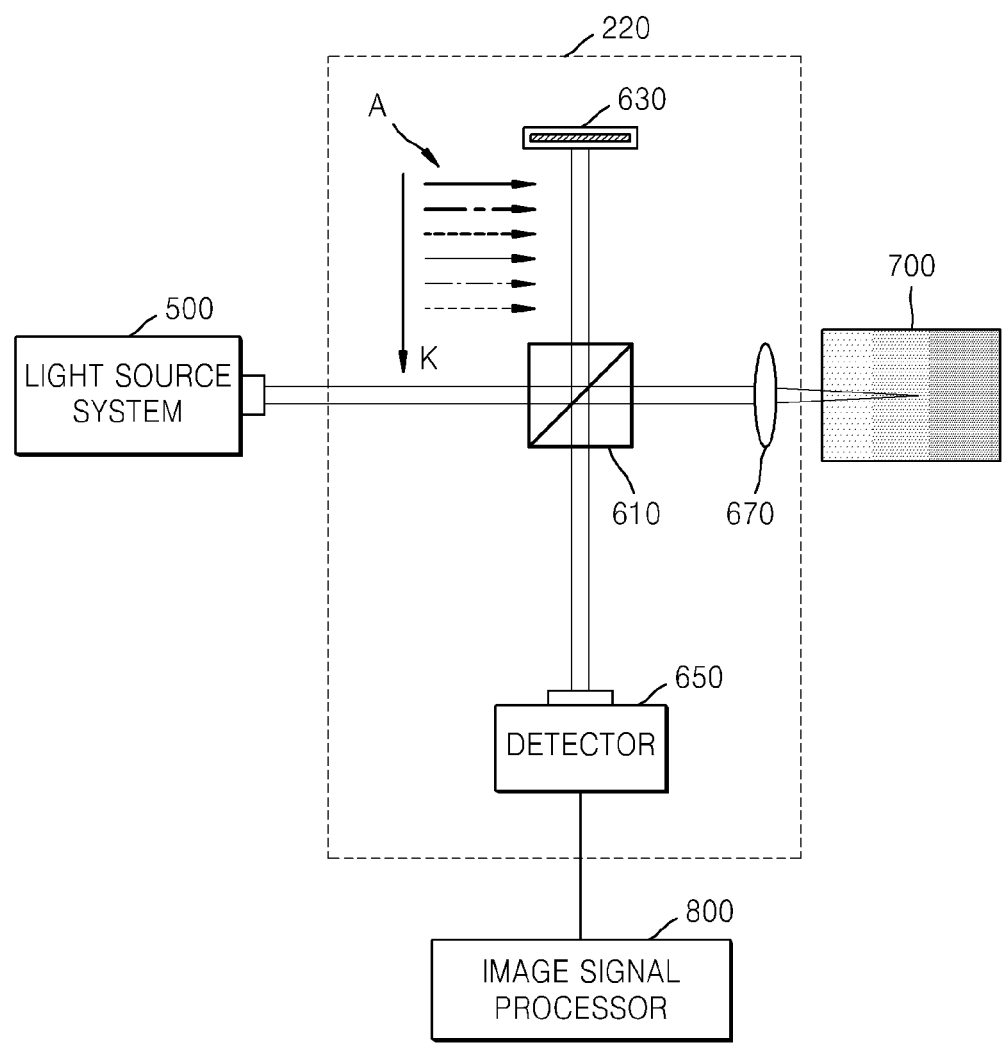
FIG. 7 schematically illustrates an optical coherence tomography apparatus (OCT) as an example of an apparatus employing a broadband wavelength-swept light source system according to an exemplary embodiment.

FIG. 7 schematically illustrates an optical coherence tomography apparatus (OCT) as an example of an apparatus employing a broadband wavelength-swept light source system according to an exemplary embodiment.

Referring to FIG. 7, the OCT apparatus may include a light source system 500, an interferometer 220, and an image signal processor 800.

The light source system 500 may be implemented by using the broadband wavelength-swept light source system according to any of the exemplary embodiments of the present invention described above with reference to FIGS. 1 to 3 and 6. Accordingly, a broadband light may be output over a predetermined time period even though, temporally, the light has a narrow wavelength FWHM (full width at half maximum). In FIG. 7, a reference symbol A indicates that a light output from a light source system is a broadband wavelength-swept light according to a wavelength-swept combination.

The interferometer 220 includes a beam splitter 610 that splits a light output from the light source system into a measurement light and a reference light, a reflective mirror 630 that reflects the reference light, a detector 650 that detects an input optical signal, and an object 700 of which the image signals are to be obtained, where the object 700 may be located on a side of the interferometer 200 toward which the measurement light transmitted from the light source system 500 and through the beam splitter 610 travels. A focusing lens 670 may be further provided between the beam splitter 610 and the object 700 to focus the measurement light onto the object. Although an example of the optical configuration of the interferometer 220 is illustrated in FIG. 7, exemplary embodiments are not limited thereto. The optical configuration of the interferometer 220 may be changed in various ways.

The measurement light split by the beam splitter 610 is directed onto the object 700 by the interferometer 220, and the interferometer 220 causes the measurement light reflected from the object 700 and the reference light reflected by the reflective mirror 630 to interfere with each other and further causes the interfering light to be detected by the detector 630.

The image signal processor 800 generates a tomographic image of the object 700 by using interference signals detected by the detector 650.

As described above, according to the one or more of the above exemplary embodiments, there is provided a broadband wavelength-swept light source system which is usable as a light source to obtain a high-resolution image and an apparatus employing the same.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the exemplary embodiments as defined by the following claims.

What is claimed is:

1. A broadband wavelength-swept light source system comprising:
   a plurality of gain mediums configured to output a corresponding plurality of lights having different center wavelengths from each other by using stimulated emission and amplification of light;
   a first light source configured to connect the plurality of gain mediums to each other in parallel and emit the plurality of lights output by the plurality of gain mediums;
   a wavelength-swept filter configured to sweep wavelengths of the plurality of lights output by the plurality of gain mediums and compensate for spectroscopic optical paths of the plurality of lights;
   a second light source configured to connect the first light source to the wavelength-swept filter in series and feed the wavelength-swept lights from the wavelength-swept filter back to the plurality of gain mediums;
   a combiner configured to combine the wavelength-swept lights fed back to the respective plurality of gain mediums and output a combined wavelength-swept light; and
   a controller configured to control an output magnitude and a wavelength region of the wavelength-swept lights fed back to the respective plurality of gain mediums by controlling at least one of a magnitude of currents respectively applied to the plurality of gain mediums and time points when the currents are respectively applied to the plurality of gain mediums,
   wherein the controller is configured to control the currents respectively applied to the plurality of gain mediums such that the wavelengths of the plurality of lights are swept in sequence through the plurality of gain mediums, the sequence being a sequence in which a first wavelength-swept light output from a first gain medium among the plurality of gain mediums is only output during a first time period and a second wavelength-swept light output from a second gain medium among the plurality of gain mediums is only output during a second time period adjacent to the first time period.

2. The broadband wavelength-swept light source system of claim 1, wherein the wavelength-swept filter comprises:
   a spectroscope configured to perform a spectral analysis of the plurality of lights output by the respective plurality of gain mediums according to wavelengths and thereby output spectral analysis light;
   a relay lens portion configured to relay and focus the spectral analysis light;
   a polygon mirror configured to reflect the spectral analysis light focused by the relay lens portion; and
   a plurality of reflective mirrors configured to reflect the spectral analysis light reflected by the polygon mirror back to the polygon mirror to thereby generate the wavelength-swept lights.

3. The broadband wavelength-swept light source system of claim 2, wherein the plurality of reflective mirrors is disposed to compensate for the spectroscopic optical paths.

4. The broadband wavelength-swept light source system of claim 3, wherein distances of the plurality of reflective mirrors from the polygon mirror are configured to be adjusted to compensate for optical path length differences due to the spectroscopic optical paths and to adjust oscillation orders of the wavelength-swept lights on a time axis.

5. The broadband wavelength-swept light source system of claim 2, wherein the spectroscope comprises a reflection-type diffraction grating.

6. The broadband wavelength-swept light source system of claim 1, further comprising a delayer configured to adjust an optical path length on a resonance path of light generated by at least one of the plurality of gain mediums.

7. The broadband wavelength-swept light source system of claim 1, wherein the controller is configured to synchronize a sweeping rate of the wavelength-swept filter with the currents respectively applied to the plurality of gain mediums.

8. The broadband wavelength-swept light source system of claim 1, further comprising:
   an optical signal extractor configured to extract an optical signal having a predetermined wavelength region from the combined wavelength-swept light; and
   a synchronization signal generator configured to generate, based on the extracted optical signal, a synchronization signal which synchronizes an operation of performing the stimulated emission and amplification of light of the plurality of gain mediums with an operation of sweeping a wavelength of the wavelength-swept filter,
   wherein the controller is configured to generate the currents to be respectively applied to the plurality of gain mediums and a control signal to control the wavelength-swept filter based on the synchronization signal.

9. The broadband wavelength-swept light source system of claim 2, further comprising:
   an optical signal extractor configured to extract an optical signal having a predetermined wavelength region from the combined wavelength-swept light; and
   a synchronization signal generator configured to generate, based on the extracted optical signal, a synchronization signal which synchronizes an operation of performing the stimulated emission and amplification of light of the plurality of gain mediums with an operation of sweeping a wavelength of the wavelength-swept filter,
   wherein the controller is configured to generate the currents to be respectively applied to the plurality of gain mediums and a control signal to control the wavelength-swept filter based on the synchronization signal.

10. The broadband wavelength-swept light source system of claim 1, further comprising:
    an optical signal extractor configured to extract an optical signal having a predetermined wavelength region from the combined wavelength-swept light; and
    a synchronization signal generator configured to generate, based on the extracted optical signal, a synchronization signal which synchronizes an operation of performing the stimulated emission and amplification of light of the plurality of gain mediums with an operation of sweeping a wavelength of the wavelength-swept filter,
    wherein the controller is configured to generate the currents to be respectively applied to the plurality of gain mediums and a control signal to control the wavelength-swept filter based on the synchronization signal.

11. An optical coherence tomography apparatus comprising:
    a broadband wavelength-swept light source system, comprising:
        a plurality of gain mediums configured to output a corresponding plurality of lights having different center wavelengths from each other by using stimulated emission and amplification of light;
        a first light source configured to connect the plurality of gain mediums to each other in parallel and emit the plurality of lights output by the plurality of gain mediums;
        a wavelength-swept filter configured to sweep wavelengths of the plurality of lights output by the plurality of gain mediums and compensate for spectroscopic optical paths of the plurality of lights;
        a second light source configured to connect the first light source to the wavelength-swept filter in series and feed the wavelength-swept lights from the wavelength-swept filter back to the plurality of gain mediums;
        a combiner configured to combine the wavelength-swept lights fed back to the respective plurality of gain mediums and output a combined wavelength-swept light; and
        a controller configured to control an output magnitude and a wavelength region of the wavelength-swept lights fed back to the respective plurality of gain mediums by controlling at least one of a magnitude of currents respectively applied to the plurality of gain mediums and time points when the currents are respectively applied to the plurality of gain mediums,
    wherein the controller is configured to control the currents respectively applied to the plurality of gain mediums such that the wavelengths of the plurality of lights are swept in sequence through the plurality of gain mediums, the sequence being a sequence in which a first wavelength-swept light output from a first gain medium among the plurality of gain mediums is only output during a first time period and a second wavelength-swept light output from a second gain medium among the plurality of gain mediums is only output during a second time period adjacent to the first time period.

12. The optical coherence tomography apparatus of claim 11, wherein the wavelength-swept filter comprises:
    a spectroscope configured to perform a spectral analysis of the plurality of lights output by the plurality of gain mediums according to wavelengths and thereby output spectral analysis light;
    a relay lens portion configured to relay and focus the spectral analysis light;
    a polygon mirror configured to reflect the spectral analysis light focused by the relay lens portion; and
    a plurality of reflective mirrors configured to reflect the spectral analysis light reflected by the polygon mirror back to the polygon mirror to thereby generate the wavelength-swept lights.

13. The optical coherence tomography apparatus of claim 12, wherein the plurality of reflective mirrors is disposed to compensate for the spectroscopic optical paths.

14. The optical coherence tomography apparatus of claim 13, wherein distances of the plurality of reflective mirrors from the polygon mirror are configured to be adjusted to compensate for optical path length differences due to the spectroscopic optical paths and to adjust oscillation orders of the wavelength-swept lights on a time axis.

15. The optical coherence tomography apparatus of claim 12, wherein the spectroscope comprises a reflection-type diffraction grating.

16. The optical coherence tomography apparatus of claim 11 further comprising a delayer configured to adjust an optical path length on a resonance path of light generated by at least one of the plurality of gain mediums.

17. The optical coherence tomography apparatus of claim 11, wherein the controller is configured to synchronize a sweeping rate of the wavelength-swept filter with the currents respectively applied to the plurality of gain mediums.

18. The optical coherence tomography apparatus of claim 11, wherein the broadband wavelength-swept light source system further comprises:
- an optical signal extractor configured to extract an optical signal having a predetermined wavelength region from the combined wavelength-swept light; and
- a synchronization signal generator configured to generate, based on the extracted optical signal, a synchronization signal which synchronizes an operation of performing the stimulated emission and amplification of light of the plurality of gain mediums with an operation of sweeping a wavelength of the wavelength-swept filter,
- wherein the controller is configured to generate the currents to be respectively applied to the plurality of gain mediums and a control signal to control the wavelength-swept filter based on the synchronization signal.

* * * * *